(12) United States Patent
Moon et al.

(10) Patent No.: US 11,456,351 B2
(45) Date of Patent: Sep. 27, 2022

(54) THIN FILM STRUCTURE INCLUDING DIELECTRIC MATERIAL LAYER AND ELECTRONIC DEVICE EMPLOYING THE SAME

(71) Applicant: Samsung Electronics Co., Ltd., Suwon-si (KR)

(72) Inventors: Taehwan Moon, Suwon-si (KR); Jinseong Heo, Seoul (KR); Sangwook Kim, Seongnam-si (KR); Yunseong Lee, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/171,291

(22) Filed: Feb. 9, 2021

(65) Prior Publication Data

US 2022/0005923 A1 Jan. 6, 2022

(30) Foreign Application Priority Data

Jul. 3, 2020 (KR) .......................... 10-2020-0082265

(51) Int. Cl.
*H01L 29/49* (2006.01)
*H01L 49/02* (2006.01)
(Continued)

(52) U.S. Cl.
CPC .......... *H01L 28/40* (2013.01); *H01L 21/0228* (2013.01); *H01L 27/1159* (2013.01); *H01L 27/11507* (2013.01); *H01L 29/401* (2013.01); *H01L 29/4908* (2013.01); *H01L 29/78391* (2014.09); *H01L 51/0525* (2013.01); *H01L 51/0529* (2013.01); *H01L 51/0537* (2013.01); *H01L 21/02181* (2013.01);
(Continued)

(58) Field of Classification Search
CPC ................. H01L 28/40; H01L 21/0228; H01L 27/11507; H01L 27/1159; H01L 29/401; H01L 29/4908; H01L 29/78391; H01L 51/0525; H01L 51/0529; H01L 51/0537; H01L 21/02181; H01L 21/02189; H01L 21/02192; H01L 21/02194; H01L 2251/303; H01L 29/516; H01L 29/786; H01L 27/11585–11597; H01L 29/6684; H01L 21/28291

See application file for complete search history.

(56) References Cited

U.S. PATENT DOCUMENTS

| 2013/0043452 A1* | 2/2013 | Meyer | ................. H01L 45/1233 |
| | | | 257/E45.001 |
| 2015/0076437 A1* | 3/2015 | Tao | ...................... H01L 45/1253 |
| | | | 257/4 |

(Continued)

FOREIGN PATENT DOCUMENTS

CN 110573652 A 12/2019

*Primary Examiner* — Shahed Ahmed
(74) *Attorney, Agent, or Firm* — Harness, Dickey & Pierce, P.L.C.

(57) ABSTRACT

Disclosed are a thin film structure and an electronic device including the same. The disclosed thin film structure includes a dielectric material layer between a first material layer and a second material layer. The dielectric material layer includes a dopant in a matrix material having a fluorite structure. The dielectric material layer is uniformly doped with a low concentration of the dopant, and has ferroelectricity.

28 Claims, 26 Drawing Sheets

(51) Int. Cl.
*H01L 51/05* (2006.01)
*H01L 29/78* (2006.01)
*H01L 21/02* (2006.01)
*H01L 29/40* (2006.01)
*H01L 27/11507* (2017.01)
*H01L 27/1159* (2017.01)

(52) U.S. Cl.
CPC .. *H01L 21/02189* (2013.01); *H01L 21/02192* (2013.01); *H01L 21/02194* (2013.01); *H01L 2251/303* (2013.01)

(56) References Cited

U.S. PATENT DOCUMENTS

| | | |
|---|---|---|
| 2015/0255267 A1 | 9/2015 | Tapily et al. |
| 2017/0103988 A1 | 4/2017 | Nishida et al. |
| 2018/0182769 A1* | 6/2018 | Cheng .................. H01L 29/516 |
| 2018/0265967 A1 | 9/2018 | Lei et al. |
| 2018/0286988 A1 | 10/2018 | Yoo |
| 2019/0057860 A1 | 2/2019 | Yoon et al. |

* cited by examiner

THIN FILM STRUCTURE INCLUDING DIELECTRIC MATERIAL LAYER AND ELECTRONIC DEVICE EMPLOYING THE SAME

CROSS-REFERENCE TO RELATED APPLICATION

This application is based on and claims priority under 35 U.S.C. § 119 to Korean Patent Application No. 10-2020-0082265, filed on Jul. 3, 2020, in the Korean Intellectual Property Office, the disclosure of which is incorporated by reference herein in its entirety.

BACKGROUND

1. Field

The present disclosure relates to a thin film structure including a dielectric material layer and an electronic device employing the same.

2. Description of Related Art

In recent years, as electronic equipment become smaller in size and the demands for higher performance increase, electronic devices employed in various kinds of electronic circuits are also required to be smaller and to have higher performance. The electronic circuits may include metal-insulator-metal (MIM) capacitors and/or metal-oxide semiconductor (MOS) transistors, and to attain miniaturized, large-capacity and high-performance electronic circuits, a dielectric material layer capable of demonstrating good operating characteristics, even with a small thickness, is needed.

SUMMARY

Provided are a thin film structure including a dielectric material layer having ferroelectricity through doping with a dopant, and an electronic device comprising the same.

Additional aspects will be set forth in part in the description which follows and, in part, will be apparent from the description, or may be learned by practice of the presented embodiments of the disclosure.

A thin film structure according to an aspect may include a first material layer; a dielectric material layer formed on the first material layer to include a dopant in a matrix material having a fluorite structure, the dielectric material layer having a ferroelectric property, in which the ratio of the concentration mean to the concentration standard deviation of the dopant in the direction of thickness is about 8 or greater, and the thickness uniformity is 90% or greater; and a second material layer formed on the dielectric material layer.

The matrix material of the dielectric material layer may be formed by atomic layer deposition.

The matrix material of the dielectric material layer may be an oxide, and may be formed by the atomic layer deposition through sequential injection cycles of a precursor and an oxidant, and the injection of the dopant may be performed between the precursor injection cycle and the oxidant injection cycle, for forming the matrix material of the dielectric material layer.

The matrix material of the dielectric material layer may include a metal oxide.

The matrix material of the dielectric material layer may include one of $HfO_2$, $ZrO_2$, and $CeO_2$.

The dopant may include at least one of Al, Si, Zr, Y, La, Gd, and Sr.

The first material layer may be a first conductive layer, the second material layer may be a second conductive layer, and the first conductive layer and the second conductive layer may include the same conductive material or conductive materials having at least one component different from each other.

At least one of the first conductive layer and the second conductive layer may include at least one of Ti, TiN, TiAlN, TiAl, Ta, TaN, W, WN, Mo, MoN, Nb, NbN, Ru, RuO, Pt, and Ni.

One of the first material layer and the second material layer may include a channel layer, and the other may include a conductive layer.

The channel layer may include one selected from a semiconductor material including one of Si, Ge, IGZO, oxide semiconductor, and a Group III-V semiconductor material, a two dimensional material, transition metal dichalcogenide, a quantum dot, and an organic material.

The thin film structure may further include a dielectric layer between the channel layer and the dielectric material layer, the dielectric layer not having a ferroelectric property.

An electronic device according to another aspect may include a base layer; and the thin film structure formed on the base layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
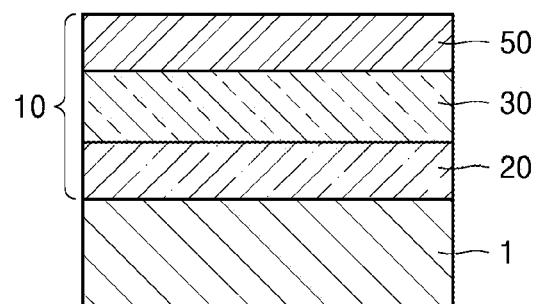
FIGS. 1 and 2 are cross-sectional views schematically illustrating thin film structures including a dielectric material layer according to some example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, some example embodiments will be described in further detail with reference to the accompanying drawings. In the following drawings, the same reference numerals refer to the elements, and the sizes of various components are exaggerated for clarity and brevity. The following embodiment are presented by way of example only, and various changes and modifications may be made from the description of these embodiments.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

In the following description, when an element is referred to as being "above" or "on" another element, it can be directly on the other element in a contact manner or in a non-contact manner. The terms "first," "second," etc. may be used to describe various elements, but these terms are only used to distinguish one element from another element. These terms may not be used to limit materials or structures of such elements. An expression used in the singular form encompasses the expression of the plural forms, unless it has a clearly different meaning in the context. In addition, it will be understood that the term "comprising or including" specifies the addition and/or presence of one or more other components, but does not preclude the possibility of excluding the stated components features, unless the context clearly indicates otherwise. The use of the term "the" and an instructional term similar thereto may be applied to both singular forms and the plural forms.

When an electric field is applied to a dielectric material, a dielectric polarization phenomenon occurs in which polarized molecules are arranged. The extent of polarization is proportional to the electrical field. The extent of dielectric polarization proportional to an electrical field applied may be represented by a permittivity. The permittivity ($\varepsilon$) of a dielectric material may be generally expressed by a relative permittivity ($\varepsilon_r$) representing a ratio relative to a dielectric constant ($\varepsilon_0$) in vacuum, and may also be called a dielectric constant. Since permittivity does not deal with absolute values, these expressions may be used interchangeably.

Meanwhile, due to the molecular structure of a dielectric material, an extent of dielectric polarization being proportional to an electrical field may vary according to a direction of electric field applied.

A ferroelectric material may exhibit a constant amount, rather than zero, of a remanent polarization even after the dielectric polarization is formed by the applied electric field (E) and the applied electric field is removed. For example, the ferroelectric material may have a polarization property depending on the hysteresis of the applied electric field (E)

and have a higher dielectric constant than a paraelectric material. For example, these properties may provide applicability for the ferroelectric material in electronic devices, (e.g., a nonvolatile memory device) because the ferroelectric material may exhibit a remanent polarization even after the applied electric field is removed.

In an example embodiment, a ferroelectric material including $HfO_2$ may be formed by preparing a solid solution, such as hafnium-zirconium-oxide (HZO) of $(Hf,Zr)O_2$, and/or doping a metal element into $HfO_2$.

Due to the low crystallization temperature of $ZrO_2$, HZO having a wide composition range in which a ferroelectric phase can be obtained may easily crystalize a thin film, while the previously formed thin film is prone to deformation due to a thermal budget, etc. applied in a subsequent process, thereby easily deteriorating current leakage characteristics.

For example, a low crystallization temperature may be advantageous s however, when a thermal budget is large, a phase transition (e.g., to a paraelectric material phase) may occur more easily. In this regard, research on ferroelectric thin films using a dopant having a high crystallization temperature, such as Al or Si is also attracting attention in a field related to ferroelectric field effect transistors (FETs).

However, the doping concentration required for ferroelectricity formation, which may range from 5% to 15%, is relative low. Thus, when a thin film is formed by atomic layer deposition (ALD), uniform doping with a dopant at a low concentration is quite difficult to achieve due to the nature of the ALD in which deposition is performed on a cycle-by-cycle basis.

When dissimilar metal elements are to be doped using the ALD, a dissimilar metal oxide may be deposited between deposition cycles of the matrix forming the oxides. Due to the nature of the ALD, which is not continuously deposited on a timely basis, respective metal element layers may be deposited in sequence.

Thus, when a cycle of deposition of an oxide thin film containing an dopant element is inserted between cycles depositing oxide thin films forming matrix using the ALD, doping concentrations may be adjusted by a ratio of matrix and dopant doping cycles, and thus, in principle, the doping concentrations in the direction of thickness may become non-uniform, making it difficult to finely adjust the doping concentrations.

However, according to a thin film structure according to an example embodiment described below, a device including a ferroelectric dielectric material layer having a more uniform concentration of dopant in a direction of thickness may be implemented by using a process of adding a small amount of the dopant.

The thin film structure according to an embodiment includes a dielectric material layer having a uniform doping concentration and exhibiting the ferroelectric property, and thus may be applied to various electronic devices including, for example, a nonvolatile memory device, such as an FERAM, a next-generation memory device, a neuromorphic device, and a capacitor.

Figure 2:
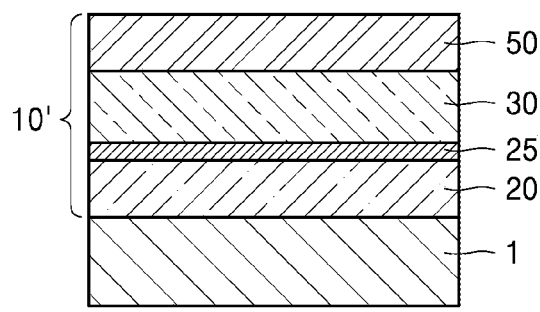

FIGS. 1 and 2 are cross-sectional views schematically illustrating a thin film structure 10 including a dielectric material layer 30 according to some example embodiments.

Referring to FIGS. 1 and 2, the thin film structures 10 and 10' according to some embodiments include a first material layer 20, a dielectric material layer 30, and a second material layer 50 sequentially stacked on a base layer 1. The dielectric material layer 30 may have a ferroelectric property. The ferroelectric property may be derived by doping a dopant and the dielectric material layer 30 may include a uniform doping concentration. Another material layer, for example, a dielectric layer 25 may be between the first material layer 20 and the dielectric material layer 30, as illustrated in FIG. 2, and/or between the dielectric material layer 30 and the second material layer 50. The dielectric layer 26 may, for example, include a material without ferroelectric properties.

The base layer 1 may include a substrate 2, such as a semiconductor substrate and/or an insulating substrate. The semiconductor substrates may include, for example, a silicon substrate, a silicon carbide substrate, a germanium substrate, a silicon-germanium substrate, and/or a Group III-V semiconductor substrate. The insulating substrate may include, for example, an aluminum oxide (e.g., sapphire) substrate, a silicon oxide substrate, and/or silicon nitride. Various electronic device structures may include the thin film structure 10 and 10', in addition to the base layer 1. In addition, for some example embodiments, the base layer 1 may further include an insulation layer 3 on the substrate 2.

Figure 3A:
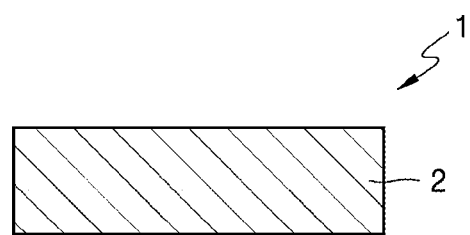
FIG. 3A illustrates an example in which a substrate is provided as a base layer.
Figure 3B:
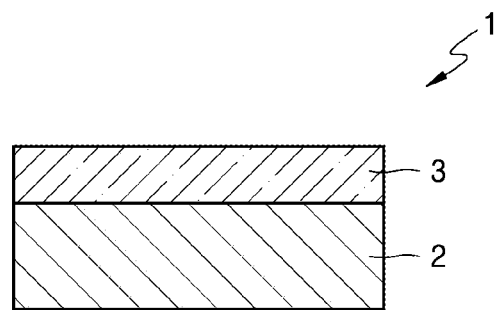
FIG. 3B illustrates an example in which a base layer includes a substrate and an insulation layer on the substrate.

FIG. 3A illustrates an example case where the base layer 1 includes a substrate 2. FIG. 3B illustrates an example case where the base layer 1 includes a substrate 2 and an insulation layer 3 on the substrate 2. For example, when the substrate 2 is a semiconductor substrate, an insulation layer 3 may be on the substrate 2, as shown in FIG. 3B. In addition, when the substrate 2 includes an insulating substrate, an insulation layer 3 may be on the substrate 2, as shown in FIG. 3B. The insulation layer 3 may be a layer configured to suppress and/or prevent electrical leakage. The insulation layer 3 may include, for example, a Si oxide (SiO, e.g., $Si_xO_y$), an Al oxide (AlO, e.g., $Al_xO_y$), a Hf oxide (HfO, e.g., $Hf_xO_y$), a Zr oxide (ZrO, e.g., $Zr_xO_y$) and/or a two-dimensional (2D) insulator. The 2D insulator may include, for example, hexagonal boron nitride (h-BN). However, the material of the insulation layer 3 is not limited to those listed above. A variety of electronic device structures employing the thin film structure 10 may be included in and/or on the base layer 1.

According to one or more embodiments, the first material layer 20 may be a first conductive layer (e.g., a lower metal electrode layer) and the second material layer 50 may be a second conductive layer (e.g., an upper metal electrode layer). The first material layer 20 and the second material layer 50 may include the same conductive material and/or may include conductive materials having at least one component different from each other. The first material layer 20 and the second material layer 50 may be included in electrode layers. For example, at least one of the first material layer 20 and the second material layer 50 may include at least one of Ti, TiN, TiAlN, TiAl, Ta, TaN, W, WN, Mo, MoN, Nb, NbN, Ru, RuO, Pt, and/or Ni.

As such, when the first material layer 20 and the second material layer 50 both include a conductive layer, the thin film structure 10 may be implemented as a capacitor device, and may including a dielectric material layer 30 having a ferroelectric property and a uniform doping concentration.

In another example embodiment, one of the first material layer 20 and/or the second material layer 50 may include a semiconductor layer, and the remainder of the first material layer 20 and/or the second material layer 50 may include a conductive layer. The semiconductor layer may, for example, be configured to form a channel layer. For example, the first material layer 20 may include a lower channel layer, and the second material layer 50 may include a conductive layer (e.g., an upper electrode layer). In another example embodiment, the first material layer 20 may include a conductive layer (e.g., a lower electrode layer), and the second material layer 50 may include an upper channel layer.

The channel layer may include a bulk semiconductor material (e.g., a silicon, a silicon carbide, a germanium, a silicon-germanium, an indium gallium zinc oxide (IGZO), an oxide semiconductor, and/or a Group III-V semiconductor material), a doped semiconductor material (e.g., a doped portion of the substrate 2), a two-dimensional material (e.g., a 2D semiconductor), transition metal dichalcogenide (e.g., $MOS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, and/or $SnTe_2$), a quantum dot, and/or an organic material (e.g., an organic semiconductor). The quantum dot may include, for example, a colloidal quantum dot and/or a nanocrystal structure. In addition, the conductive layer employed as the other of the first and second material layers 50 may include a conductive material including, for example, at least one of Ti, TiN, TiAlN, TiAl, Ta, TaN, W, WN, Mo, MoN, Nb, NbN, Ru, RuO, Pt, and/or Ni.

In an example embodiment, the first material layer 20 may include a lower semiconductor channel layer and the second material layer 50 may include an upper electrode layer. As shown in FIG. 2, a dielectric layer 25 without ferroelectric properties may be between the first material layer 20, (e.g., the lower semiconductor channel layer) and the dielectric material layer 30.

As such, when one of the first material layer 20 and the second material layer 50 includes a channel layer and the other includes a conductive layer, the thin film structure 10, according to an example embodiment, may be implemented as a capacitor device and/or a gate structure of a transistor device which includes the dielectric material layer 30 having a ferroelectric property and a uniform doping concentration. An electronic device including the thin film structure 10 may be implemented as a high-performance and small-sized memory device and/or be included in a neuromorphic device.

The dielectric material layer 30 may be on the first material layer 20 and may be configured to exhibit a ferroelectric property and to have a uniform doping concentration. The dielectric material layer 30 may include a dopant. For example the dielectric material layer 30 may include a matrix material having a fluorite structure with a dopant inclusion and/or substitution. The dielectric material layer 30 may include a dopant concentration within a range in which a ferroelectric property is exhibited For example, the dopant may be included at a low concentration. In some example embodiments, the dielectric material layer 30 having a low concentration, ranging from about 5% to about 15%, for example, of dopant may exhibit the ferroelectric property.

The dielectric material layer 30 may include a ratio of a mean concentration (m) to the concentration standard deviation (σ) (e.g., m/σ) of the dopant, in a thickness direction (e.g., a vertical and/or y-direction), of about 8 or greater. The dielectric material layer 30 may have a uniform thickness. For example, the thickness uniformity of the dielectric material layer may be about 90% or greater. The dielectric material layer 30 may be formed, for example, by atomic layer deposition. The uniform thickness and uniform dopant concentration may, for example, enhance the durability of the dielectric material layer 30, by preventing the formation of damage prone areas wherein force and/or defects may accumulate, and/or slip planes may form. Therefore, the dielectric material layer 30 may include a ferroelectric layer having an improved ferroelectric property and enhanced endurance.

The dielectric material layer 30 may include a matrix and may be formed by the atomic layer deposition. The matrix material of the dielectric material layer 30 may include an oxide and may be formed as a complete solid solution. For example, the matrix material of the dielectric material layer 30 may include a compositional range between two or more end-member oxides that may substitute the elemental composition in one or more atomic sites. For example, a cation of the oxide may be substituted with a cation including a different element. The end-members in the complete solid solution may be similar in size and charge, and may, for example, comprise a ratio of 1:0, 0:1, and/or any intermediate ratio of either end-member.

For example, the matrix material of the dielectric material layer 30 may be formed by the atomic layer deposition through sequential injection cycles of a precursor and an oxidant. The precursor of the matrix material may be, for example, a metal precursor. When the precursor of the matrix material is a metal precursor, the matrix material of the dielectric material layer 30 may be a metal oxide. For example, the matrix material of the dielectric material layer 30 may be an oxide, such as $HfO_2$, $ZrO_2$, and/or $CeO2$, and may be a complete solid solution of these materials.

Meanwhile, the dopant of the dielectric material layer 30 may include, for example, at least one of Al, Si, Zr, Y, La, Gd, Sr, and/or a combination thereof.

In some example embodiments, the dielectric material layer 30 may include $HfO_2$ uniformly doped with an aluminum (Al) dopant at a concentration wherein the dielectric material layer 30 exhibits a ferroelectric property. For example, the concentration of the Al dopant may range from about 5% to about 15%.

The dopant may be injected into the matrix material of the dielectric material layer 30 may be during the atomic layer deposition through of the dielectric material layer 30, by including sequential injection cycles of the precursor (e.g., the metal precursor) of the matrix material and the oxidant, and, for injection of the dopant, a dopant sub-cycle (SC) doping between the sequential injection cycles of the precursor and the oxidant. In an example embodiment, the sub-cycle (SC) doping may be performed after a precursor injection cycle, for example, after the metal precursor injection cycle.

Accordingly, in the middle of forming the matrix material by the atomic layer deposition through sequential injection cycles of the precursor of the matrix material and the oxidant, the dopant sub-cycle is added after the precursor injection cycle, and thus the dopant may be uniformly, lightly doped into the matrix material. Therefore, the dielectric material layer 30 is capable of achieving a ferroelectric layer having a uniform doping concentration, in which the ratio of the concentration mean (m) to the concentration standard deviation (σ) (that is, m/σ) of the dopant in the direction of thickness is about 8 or greater.

In an example embodiment, when the dielectric material layer 30 is formed by doping $HfO_2$ with an Al dopant, so as to exhibit a ferroelectric property, the matrix material of $HfO_2$ may be formed by atomic layer deposition through sequential injection cycles of a Hf precursor and an oxidant, and in the middle of the sequential injection, Al dopant sub-cycle (SC) doping may be performed after the Hf precursor injection cycle, followed by the oxidant injection cycle. Accordingly, the dielectric material layer 30 having a ferroelectric property may be formed using $HfO_2$ uniformly, lightly doped with Al.

Figure 4:
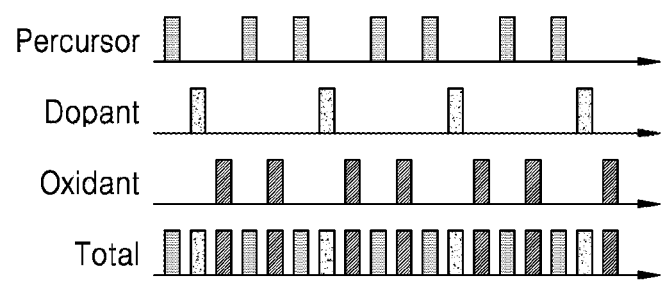
FIG. 4 illustrates relationships among a precursor injection cycle, an oxidant injection cycle, and dopant injection sub-cycle, for forming a doped dielectric material layer according to some example embodiments using an atomic layer deposition method.
Figure 5A:
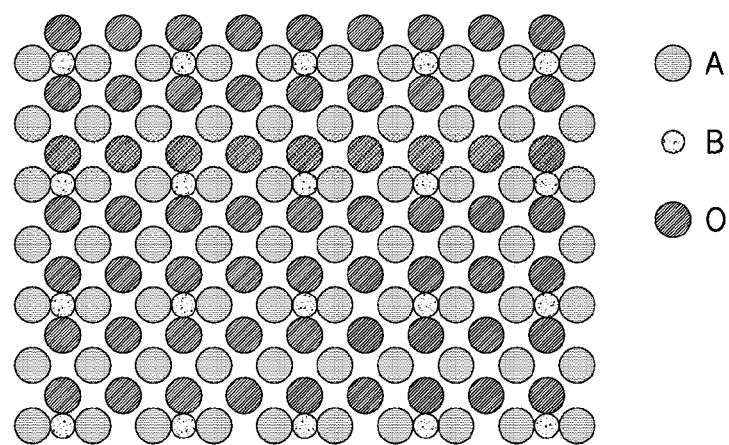
FIG. 5A schematically illustrates a diagrammatic view of a dielectric material layer according to some example embodiments uniformly doped at a low concentration using the atomic layer deposition method shown in FIG. 4.
Figure 5B:
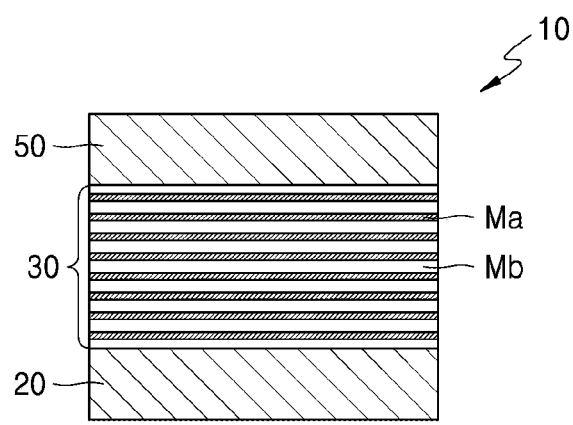
FIG. 5B illustrates an example type of sub-cycle doping of a dielectric material layer in a thin film structure according to some example embodiments.

FIG. 4 illustrates relationships among a precursor injection cycle, an oxidant injection cycle, and dopant injection sub-cycle, for forming a doped dielectric material layer according to some example embodiments using an atomic layer deposition method. FIG. 5A schematically illustrates a diagrammatic view of a uniformly, lightly doped dielectric material layer 30 according to some example embodiments using the atomic layer deposition method shown in FIG. 4. FIG. 5B illustrates an example type of a sub-cycle (SC) doping of a dielectric material layer 30 in a thin film structure 10 according to some example embodiments. In FIG. 5A, reference character A denotes the precursor, reference character B denotes the dopant, and reference character O denotes oxygen.

Referring to FIG. 4, in order to form the uniformly, lightly doped dielectric material layer 30 so as to exhibit a ferroelectric property, in the middle of forming a matrix material, for example, by atomic layer deposition through sequential injection cycles of a precursor of matrix material and an oxidant the dopant sub-cycle doping is inserted after the precursor injection cycle. For example, the doping cycle may be performed between alternating cycles of the precursor injection cycle and the oxidant injection cycle, as shown in FIG. 4.

In this case, as illustrated by the diagrammatic view of FIG. 5A, the dopant (B) is not independently oxidized but is oxidized in a state in which it is adsorbed into spaces unoccupied by the precursor (A) deposited by atomic layer deposition, and thus only an extremely small amount of the dopant (B) may be doped, suggesting that the amount of the dopant (B) doped for each dopant addition of a cycle may be extremely small. Since the extremely small amount of the dopant (B) is uniformly doped in the direction of thickness (e.g., a direction of deposition), low-concentration doping can be achieved in a matrix configured to exhibit a ferroelectric property, and uniformity of doping concentrations in the direction of thickness can be secured. In FIG. 5B, reference character Ma denotes a region where an extremely small amount of dopant exist in the dielectric material layer 30, and reference character Mb denotes a region where no dopant exists. As illustrated in FIG. 5B, since only the extremely small amount of dopant is doped for each dopant addition of a cycle through sub-cycle doping, the sub-cycle doping includes a large number of cycles for achieving a desired doping concentration, and thus uniformity of doping concentrations of the dielectric material layer 30 may be increased as a whole, thereby securing uniformity of the doping concentration in the direction of thickness.

Figure 6:
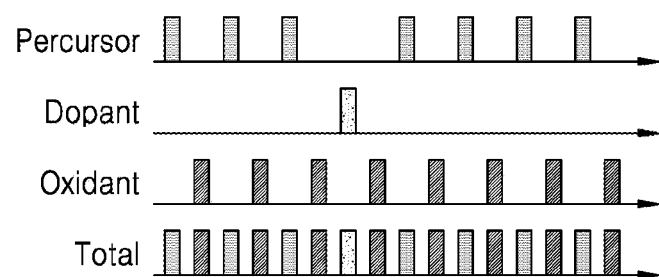
FIG. 6 illustrates the relationships among a precursor injection cycle, an oxidant injection cycle, and dopant injection cycle, for forming a doped dielectric material layer according to a Comparative Example using an atomic layer deposition method.
Figure 7A:
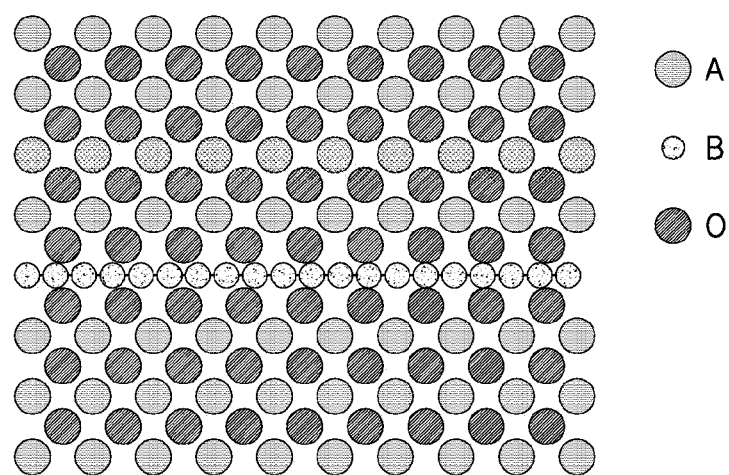
FIG. 7A schematically illustrates a diagrammatic view of a doped dielectric material layer according to the Comparative Example produced by using the atomic layer deposition method of FIG. 6.
Figure 7B:
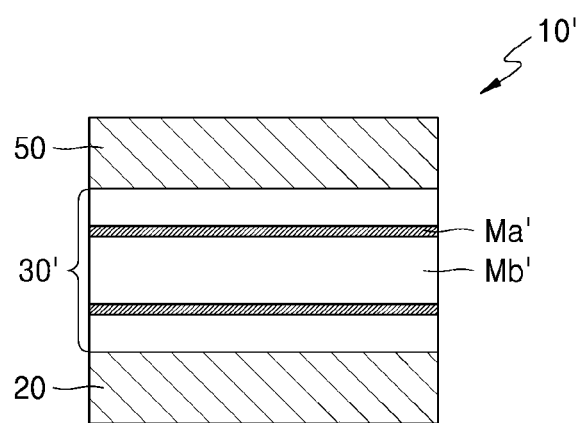
FIG. 7B schematically illustrates a doping type of a dielectric material layer in a thin film structure according to the Comparative Example.

FIG. 6 illustrates the relationship between a precursor injection cycle, an oxidant injection cycle, and dopant injection cycle, for forming a doped dielectric material layer (30') according to Comparative Example using an atomic layer deposition method. FIG. 7A schematically illustrates a diagrammatic view of a doped dielectric material layer according to the Comparative Example produced by using the atomic layer deposition method of FIG. 6. FIG. 7B schematically illustrates a doping type of a dielectric material layer 30' in a thin film structure 10' according to the Comparative Example. In the Comparative Example of FIG. 7B, the thin film structure 10' is represented by way of example as being different from the thin film structure 10 shown in FIGS. 1 and 5B only in the dielectric material layer 30'. In FIG. 7A, reference character A denotes the precursor, reference character denotes B the dopant, and reference character O denotes oxygen.

Referring to FIG. 6, in the thin film structure 10' according to the Comparative Example, for doping the dielectric material layer 30' at a low concentration so as to exhibit a ferroelectric property, in the middle of forming a matrix material by atomic layer deposition through sequential injection cycles of a precursor of a matrix material and an oxidant, for example, a dopant may be injected instead of the precursor injection.

That is, according to the Comparative Example, the dopant is injected, instead of a precursor injection, and thus the doping cycle may be performed between oxidant injection cycles, as shown in FIG. 6. In this case, as illustrated by the diagrammatic view of FIG. 7A, the dopant (B) is oxidized independent of the precursor (A). That is, in the Comparative Example, as illustrated by the diagrammatic view of FIG. 7A, in order to form an AO thin film doped with the dopant (B), for example, a dissimilar metal dopant, BO deposition may be performed for every n cycles of AO deposition. According to the Comparative Example, the light doping of the dielectric material layer 30', which is required for exhibiting a ferroelectric property, is difficult to achieve, and the doping concentration in the direction of thickness becomes non-uniform. In FIG. 7B, reference character Ma' denotes a region where a dopant exists in the dielectric material layer 30', and reference character Mb' denotes a region where no dopant exists. As illustrated in FIG. 7B, according to the Comparative Example in which the dopant doping cycle is performed, instead of the precursor injection cycle, since the dopant is independently oxidized, a large amount of dopant may be doped for each dopant addition cycle, suggesting that a smaller number of doping cycles are performed in the doping according to the Comparative Example than in the sub-cycle (SC) doping according to some example embodiments, to achieve a desired doping concentration, and the uniformity of doping concentrations in the direction of thickness may become non-uniform for the dielectric material layer 30' as a whole.

In an example embodiment, in order to form a dielectric material layer having a ferroelectric property, various deposition methods may be used and, for example, atomic layer deposition (ALD) may be suitably used. In the atomic layer deposition, a metal oxide may be deposited by alternately injecting a precursor of a metal element and an oxidant as an oxygen source.

When dissimilar metal elements are to be doped using atomic layer deposition for forming a dielectric material layer having a ferroelectric property using a dopant, a dissimilar metal oxide to be doped may be deposited between deposition cycles of matrix forming oxides, and due to the nature of the atomic layer deposition that is not continuously deposited over time, the respective metal element layers may be deposited in sequence.

The dielectric material layer 30' according to the Comparative Example as described with reference to FIGS. 6, 7A and 7B may be formed such that BO deposition may be performed for every n cycles of AO deposition to form an AO thin film doped with the dissimilar metal dopant B. However, according to such a deposition method, locally higher concentrations of the dopant B may be induced to the matrix and it may be difficult to adjust the minimum concentration of the dopant B per deposition. As described above, the deposition cycle of the oxide thin film containing dopant elements is inserted between the deposition cycles of matrix forming oxide thin film using the atomic layer deposition method. Thus, in the case of using the atomic layer deposition method according to Comparative Example, doping concentrations are adjusted by a ratio of matrix and dopant cycles, and thus, in principle, the doping concentrations in the direction of thickness may become non-uniform, making it difficult to finely adjust the doping concentrations.

By contrast, in forming the dielectric material layer 30 of the thin film structure 10 according to one or more embodiments, sub-cycle (SC) doping is performed in the middle of depositing oxide thin films by alternately injecting a precursor of a metal element and an oxidant as an oxygen source using atomic layer deposition, thereby obtaining the dielectric material layer 30 having a ferroelectric property with improved uniformity of doping concentrations of the dopant.

For example, a sub-cycle (SC) doping may be performed between the precursor injection cycle and the oxidant injection cycle. The amount of dopant added for each dopant addition of a cycle in the SC doping according to the embodiment may be much smaller than that in the doping according to the Comparative Example, and thus only an extremely small amount of the dopant may be doped for each dopant addition of a cycle, thereby improving the uniformity of doping concentrations in the direction of thickness, and ultimately enhancing the ferroelectric property and endurance of the dielectric material layer 30.

Hereinafter, example comparisons of an example embodiment of the disclosure and the Comparative Example will be described through the formation of an $HfO_2$ based dielectric material layer 30 having a ferroelectric property by doping a metal element, for example, Al, into $HfO_2$.

Figure 8:
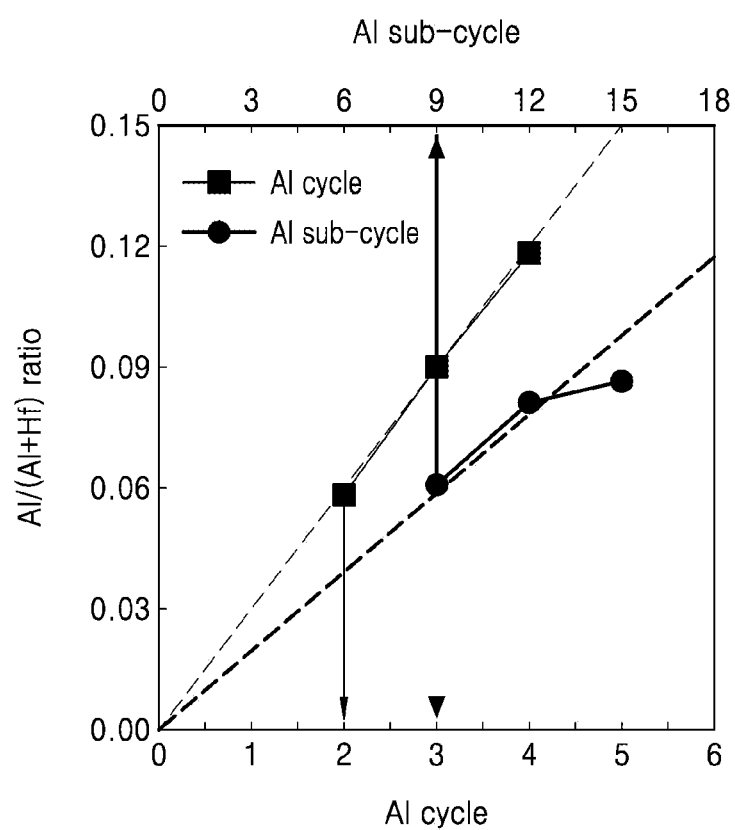
FIG. 8 is a graph illustrating Al:Hf composition ratios according to the number of doping cycles in doping applied to an example embodiment and a Comparative Example, identified by inductively coupled plasma-mass spectroscopy (ICP-MS), showing proportions of Hf and Al cations when Al is doped.

FIG. 8 is a graph illustrating Al:Hf composition ratios depending on the number of doping cycles in doping applied to an example embodiment and a Comparative Example, identified by inductively coupled plasma-mass spectroscopy (ICP-MS), representing proportions of Hf and Al cations when Al is doped. In FIG. 8, general doping according to the Comparative Example is applied to the Al cycle, and the sub-cycle (SC) doping according to an example embodiment is applied to the Al sub-cycle. As illustrated, when a dielectric material layer is to be doped with 6% Al, the doping according to the Comparative Example may include two injections of Al while the SC doping according to the example embodiment may include nine injections of Al.

Figure 9A:
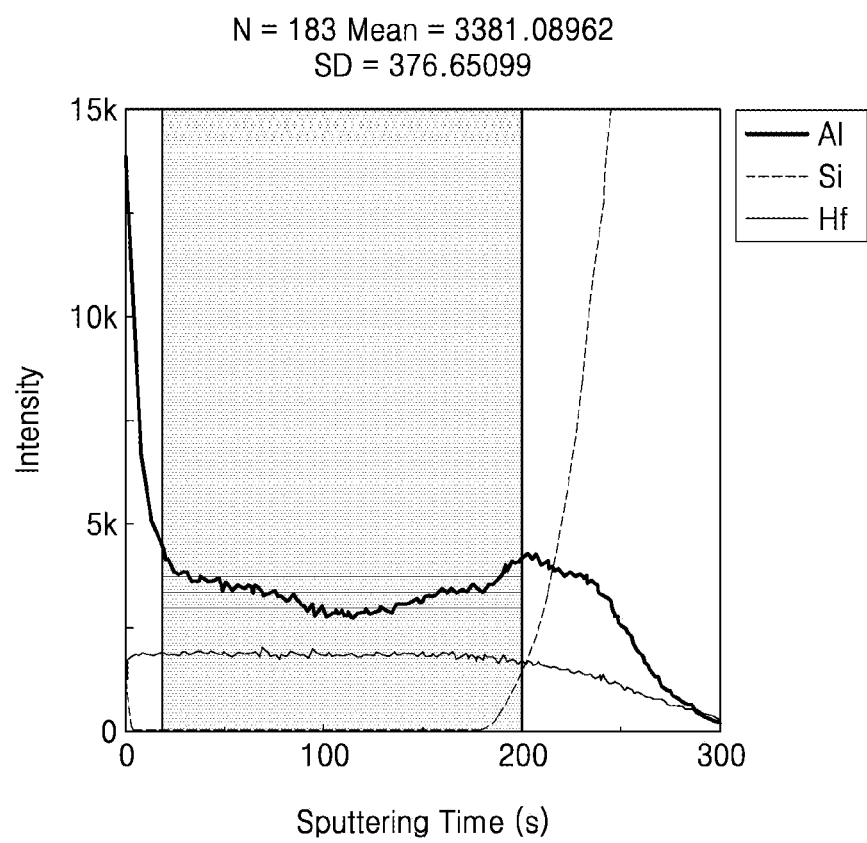
FIGS. 9A and 9B respectively illustrate a graph illustrating a thickness-wise distribution of elements in a dielectric material layer using sub-cycle (SC) doping according to the example embodiment of FIG. 8, identified by secondary ion mass spectroscopy (SIMS), and a histogram illustrating for each range of signal intensity of Al ions detected from the dielectric material layer.
Figure 9B:
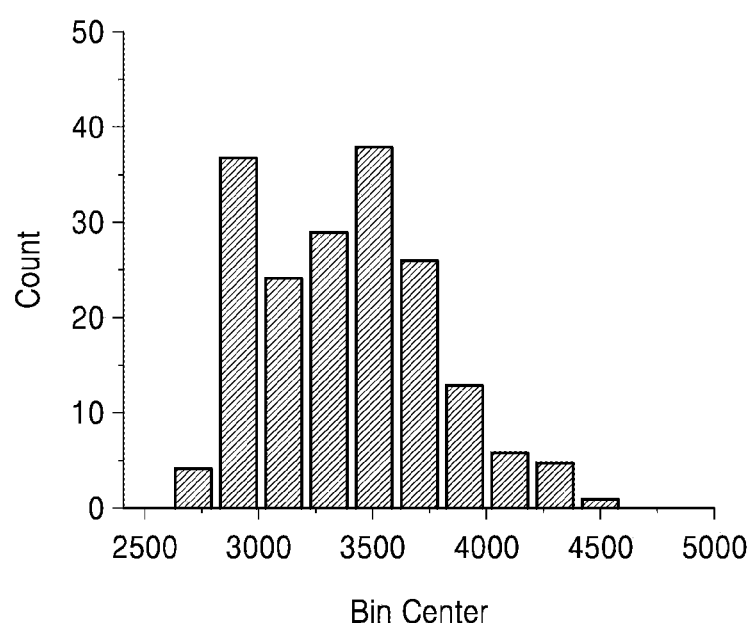
Figure 10A:
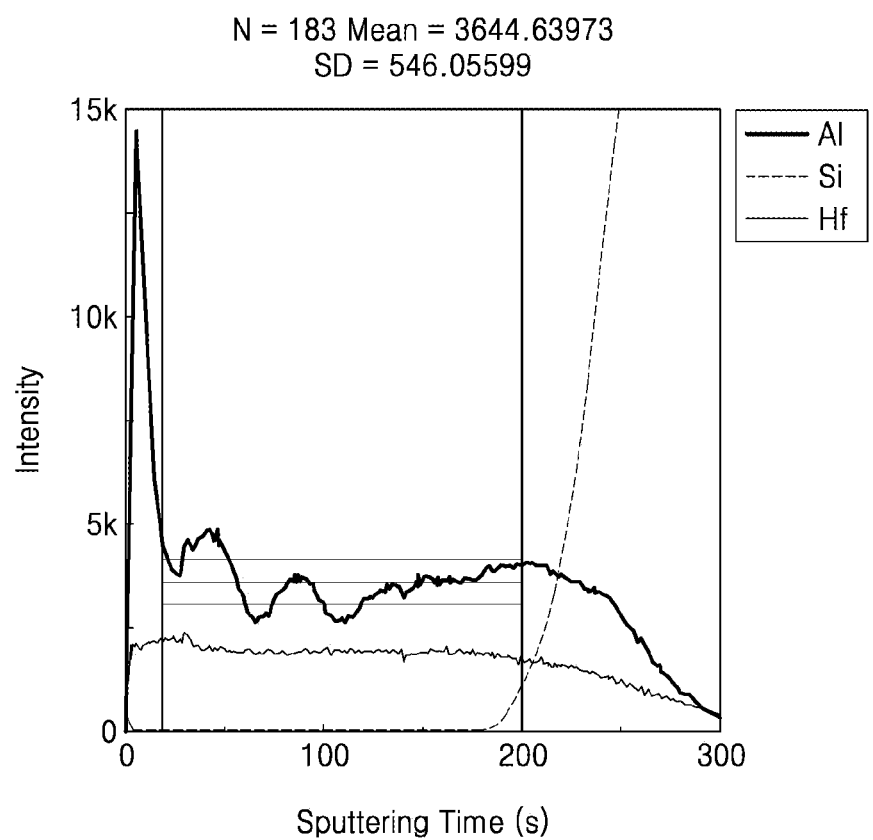
FIGS. 10A and 10B respectively illustrate a graph representing a thickness-wise distribution of elements in a dielectric material layer using doping according to the Comparative Example of FIG. 8, identified by SIMS, and a histogram illustrating for each range of signal intensity of Al ions detected from the dielectric material layer.
Figure 10B:
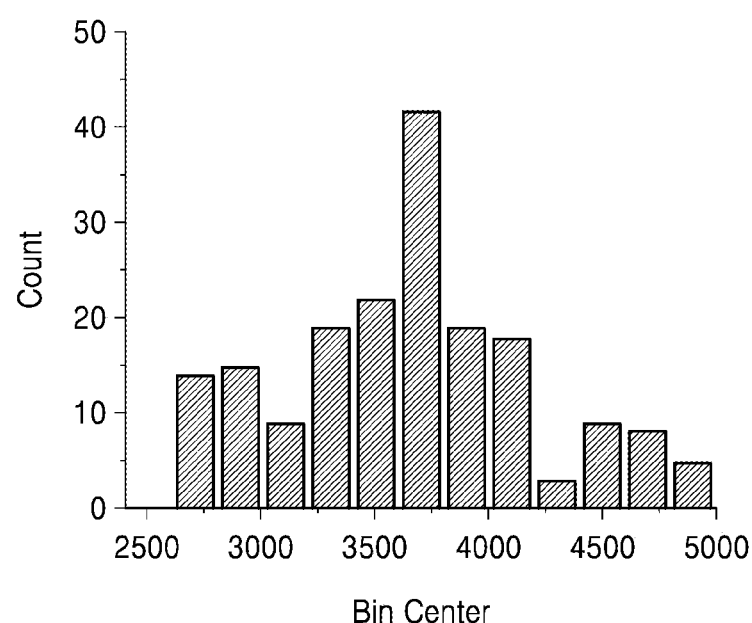

FIGS. 9A and 9B illustrate a graph representing a thickness-wise distribution of elements in a dielectric material layer 30 using sub-cycle (SC) doping according to the example embodiment of FIG. 8, identified by secondary ion mass spectroscopy (SIMS), and histograms represented each signal intensity range for Al ions detected from the dielectric material layer 30, respectively. FIGS. 10A and 10B illustrate a graph representing a thickness-wise distribution of elements in a dielectric material layer 30' using doping according to the Comparative Example of FIG. 8, identified by SIMS, and histograms represented for each signal intensity range for Al ions detected from the dielectric material layer 30', respectively.

In FIGS. 9A and 9B, the ion signal intensity in the direction of thickness for a sample of a 21 nm thickness $HfO_2$ thin film formed by performing Al injection of 27 cycles through SC doping according to the example embodiment, and histograms for the Al ion signal intensities for the sample of the embodiment, are illustrated. In FIGS. 10A and 10B, the ion signal intensity in the direction of thickness for a sample of a 21 nm thickness $HfO_2$ thin film formed by performing Al injection of 6 cycles according to the Comparative Example, and histograms for the Al ion signal intensities for the sampled of the comparative example, are illustrated.

As understood from the comparison of FIGS. 9A and 10A and comparison of FIGS. 9B and 10B, when the SC doping is applied, like in one or more embodiments of the present disclosure, the Al concentrations are more uniformly distributed in the direction of thickness. Considering that the signal intensity is proportional to the ion concentration, the uniformity of concentrations may be scaled by the ratio of the mean (m) to the standard deviation ($\sigma$). The uniformity of doping concentrations is about 8.98 in the SC doping according to the example embodiment and is about 6.67 in the doping according to comparative example, confirming that the SC doping according to the embodiment leads to an increased uniformity. That is, according to the example embodiment, the dielectric material layer 30 may be formed to have a doping concentration uniformity of about 8 or greater, as scaled by the ratio of the concentration mean to the concentration standard deviation of dopant in the direction of thickness. In addition, with this doping concentration uniformity, since only an extremely small amount of dopant (B) is doped for each dopant addition of a cycle, the dielectric material layer 30 formed by atomic layer deposition may also have a thickness uniformity of 90% or greater.

Figure 11A:
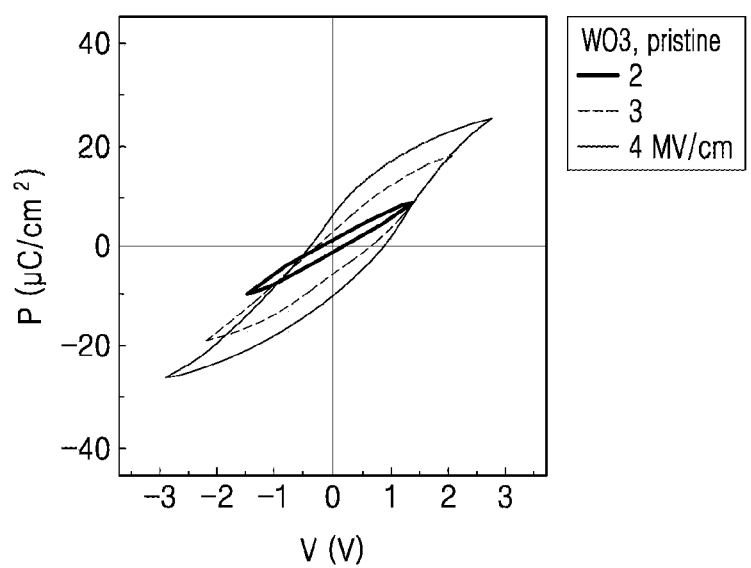
FIGS. 11A and 11B illustrate hysteresis curves of a device including a thin film structure according to an example embodiment, represented by P-V curves in pristine and woken-up states when a dielectric material layer is formed as a 7 nm thick, 6%-Al doped HfO2 thin film through SC doping.
Figure 11B:
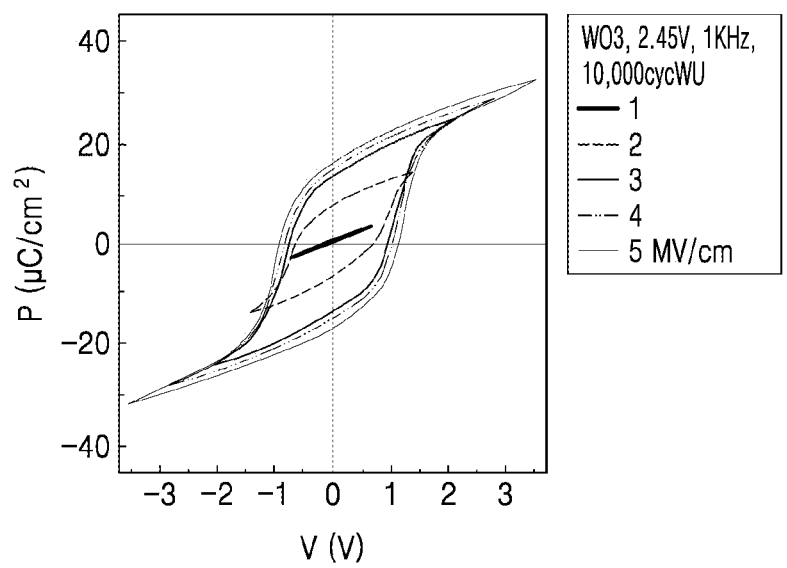
Figure 12A:
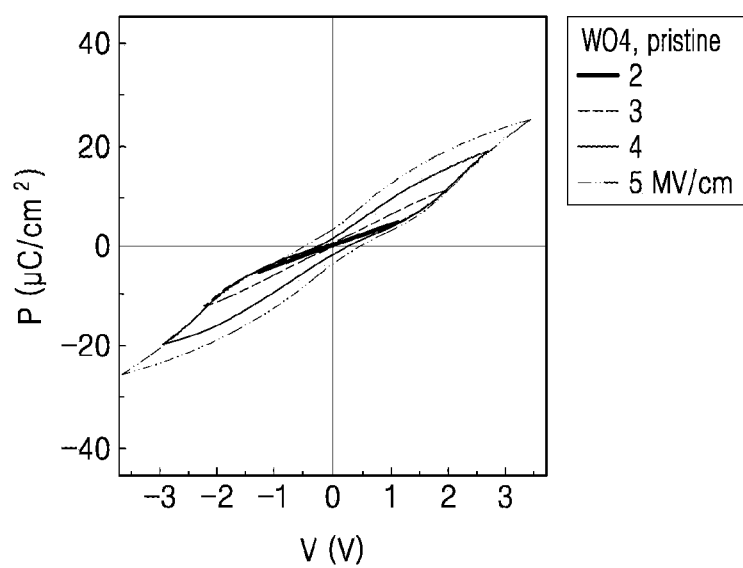
FIGS. 12A and 12B illustrate hysteresis curves of a device including a thin film structure according to an example embodiment, represented by P-V curves in pristine and woken-up states when a dielectric material layer is formed as a 7 nm thick, 8%-Al doped HfO2 thin film through SC doping.
Figure 12B:
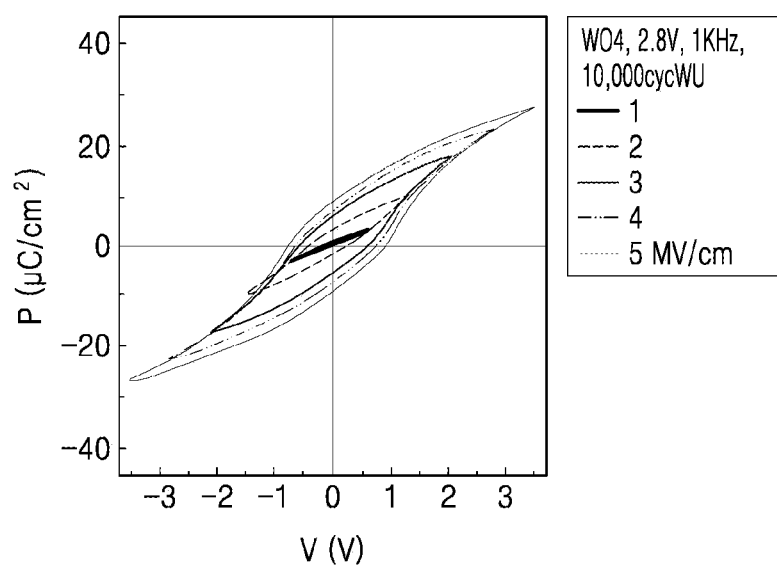

FIGS. 11A, 11B, 12A, and 12B illustrate hysteresis curves of a device including a thin film structure 10 according to an example embodiment. Specifically, FIGS. 11A and 11B illustrate P-V curves in pristine and woken-up states when a dielectric material layer 30 is formed to a 7 nm thickness, and includes 6%-Al doped $HfO_2$ thin film through SC doping. FIGS. 12A and 12B illustrate P-V curves in pristine and woken-up states when a dielectric material layer 30 is formed to a 7 nm thickness, and includes 8%-Al doped $HfO_2$ thin film through SC doping.

As shown in FIGS. 11A and 11B, when Al is SC-doped into a 7 nm thick $HfO_2$ film at a concentration of 6%, the resulting film exhibits a ferroelectric property from its pristine state, and shows a large $2P_r$ value ($>35$ $\mu C/cm^2$) after it is woken up. In comparison, as shown in FIGS. 12A and 12B, when Al is SC-doped into a 7 nm thick $HfO_2$ film at a concentration of 8%, the film exhibits an anti-ferroelectric property in the pristine state, and exhibits a ferroelectric property after it is woken up, representing a difference in $V_c$ according to the driving voltage suitable for application to a multi-level or neuromorphic device.

Figure 13A:
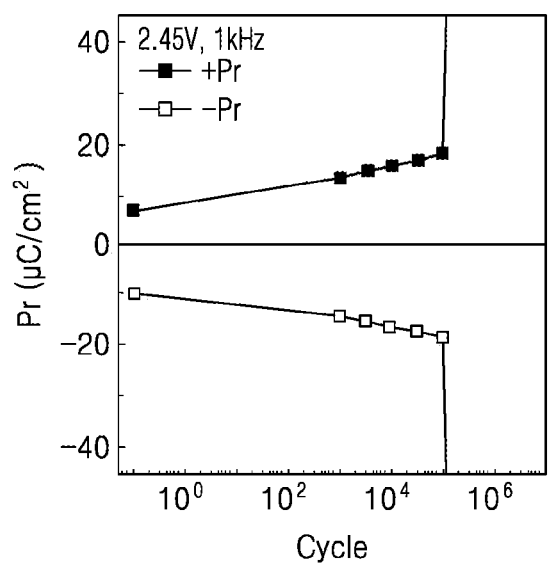
FIGS. 13A and 13B illustrate endurance property and P-V curve changes according to cycles in a device including a thin film structure according to an example embodiment when a dielectric material layer is formed as a 7 nm thick, 6%-Al doped HfO2 thin film through SC doping.
Figure 13B:
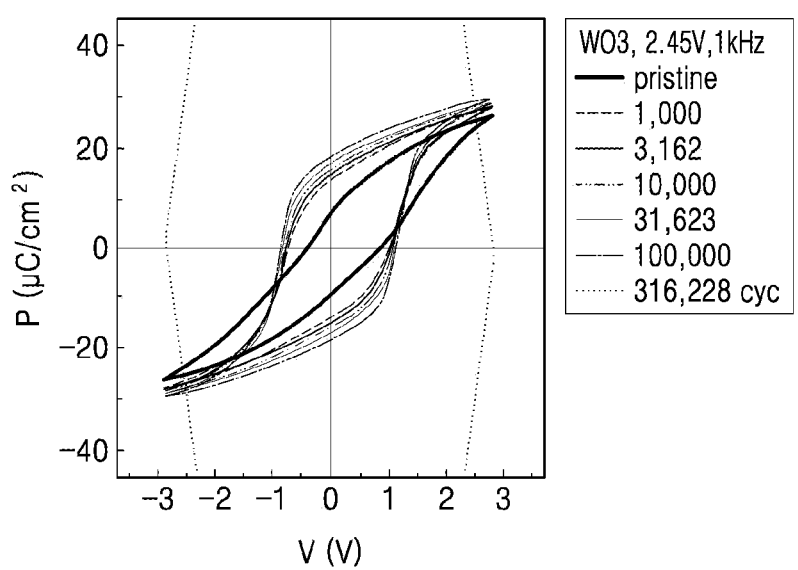
Figure 14A:
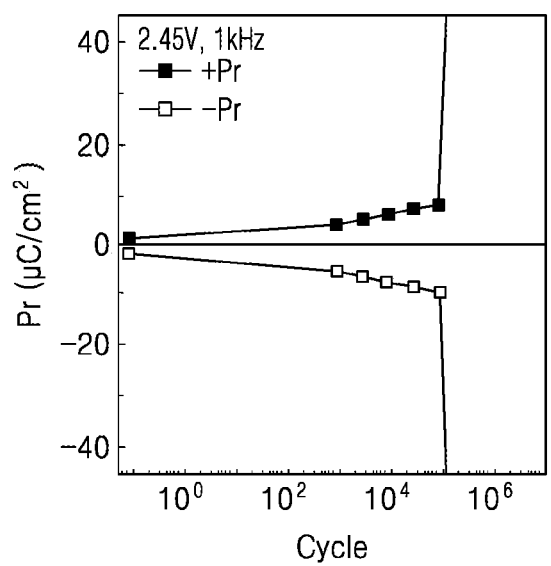
FIGS. 14A and 14B illustrate endurance property and P-V curve changes according to cycles of a device including a thin film structure according to an embodiment when a dielectric material layer is formed as a 7 nm thick, 8%-Al doped HfO2 thin film through SC doping.
Figure 14B:
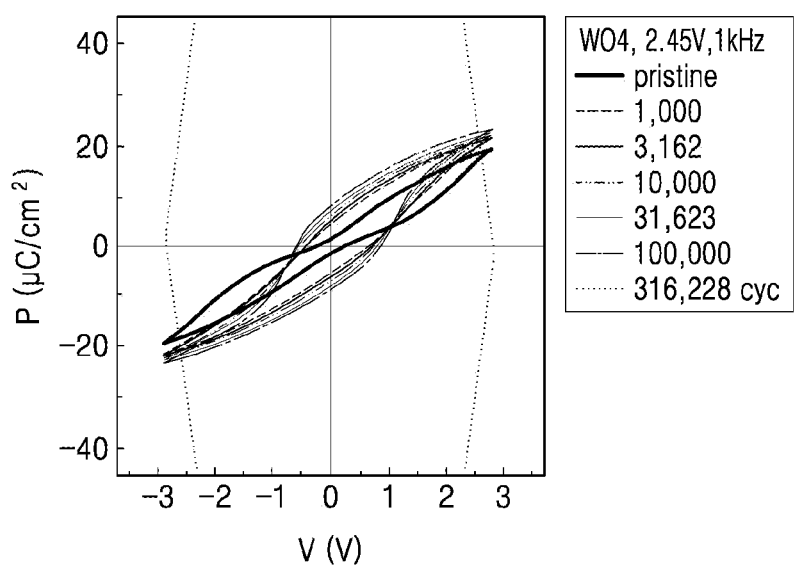

FIGS. 13A and 13B illustrate endurance property and P-V curve changes according to cycles of a device including a thin film structure 10 according to an example embodiment when a dielectric material layer 30 is formed to a 7 nm thickness, including 6%-Al doped $HfO_2$ thin film through SC doping. FIGS. 14A and 14B illustrate endurance property and P-V curve changes according to cycles of a device including a thin film structure 10 according to an example embodiment when a dielectric material layer 30 is formed to a 7 nm thickness, including 8%-Al doped $HfO_2$ thin film through SC doping.

As shown in FIGS. 13A, 13B, 14A and 14B, the devices, for example, capacitors, including the 7 nm thickness and the 6%-Al doped $HfO_2$ thin film and the 7 nm thickness and the 8%-Al doped $HfO_2$ thin film, each formed from the dielectric material layer 30, may exhibit a wake-up phenomenon that switchable spontaneous polarization increases with the application of an electrical signal. In addition, the spontaneous polarization of the thin film may steadily increase until the polarization of the thin film is switched $10^5$ times with an electrical field of 3.5 MV/cm.

Figure 15A:
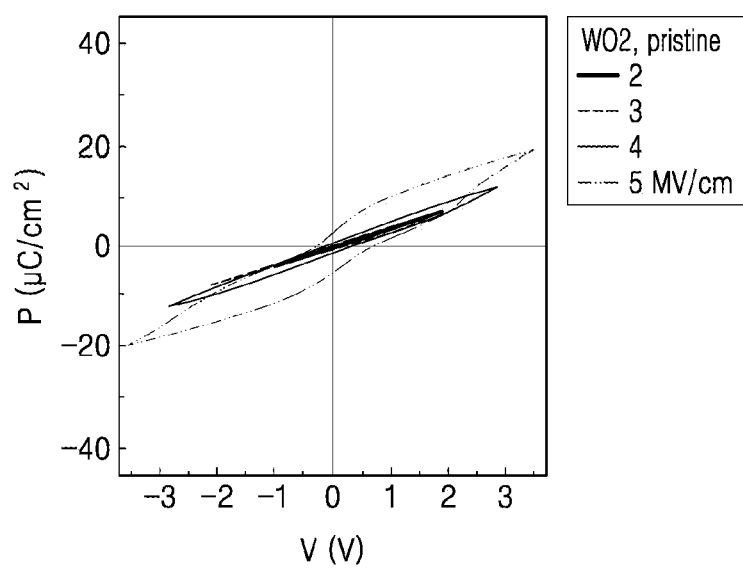
FIGS. 15A and 15B illustrate P-V curves in pristine and woken-up states when a dielectric material layer is formed as a 6%-Al doped 7 nm HfO2 thin film according to the Comparative Example.
Figure 15B:
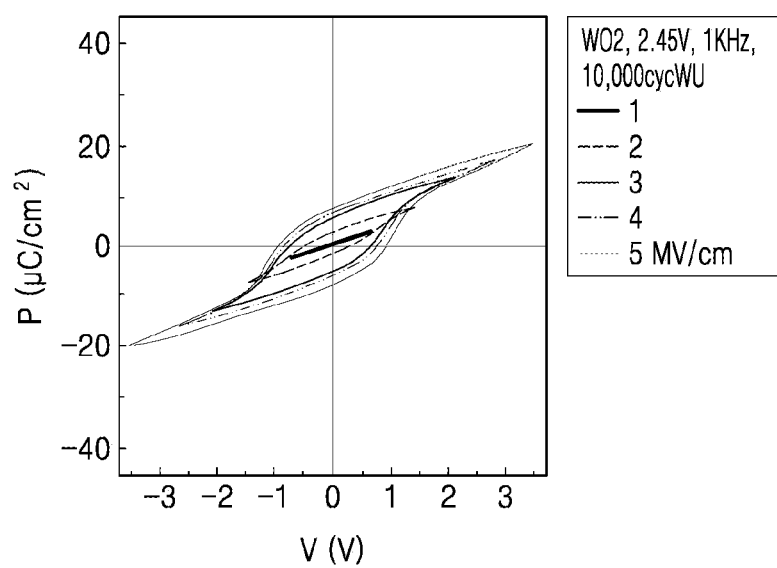

FIGS. 15A and 15B illustrate P-V curves in pristine and woken-up states when a dielectric material layer 30' is formed to a 7 nm thickness, including 6%-Al doped $HfO_2$ thin film, according to the Comparative Example.

As confirmed from the comparison results shown in FIGS. 15A, 15B, 11A and 11B, a sample formed according to the Comparative Example has a low uniformity in dopant distribution, exhibits an anti-ferroelectric property in a pristine state even with the same composition of Al with the sample formed according to the embodiment, and shows a relatively small $2P_r$ value (<20 $\mu C/cm^2$) even after being woken up.

Figure 16A:
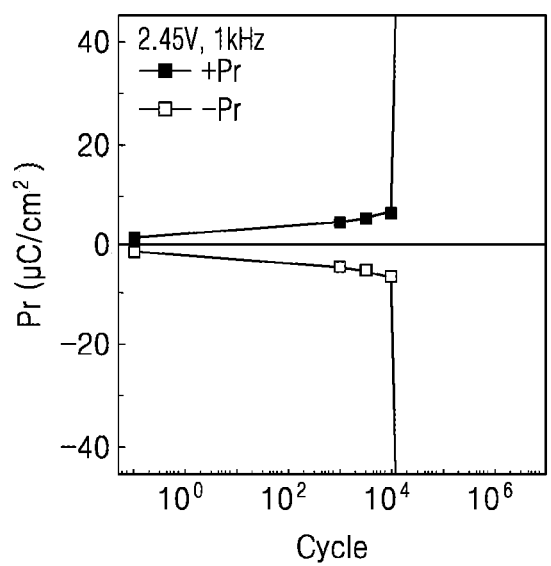
FIGS. 16A and 16B illustrate endurance property and P-V curve changes according to cycles of a device when a dielectric material layer is formed as the 6%-Al doped 7 nm HfO2 thin film according to the Comparative Example.
Figure 16B:
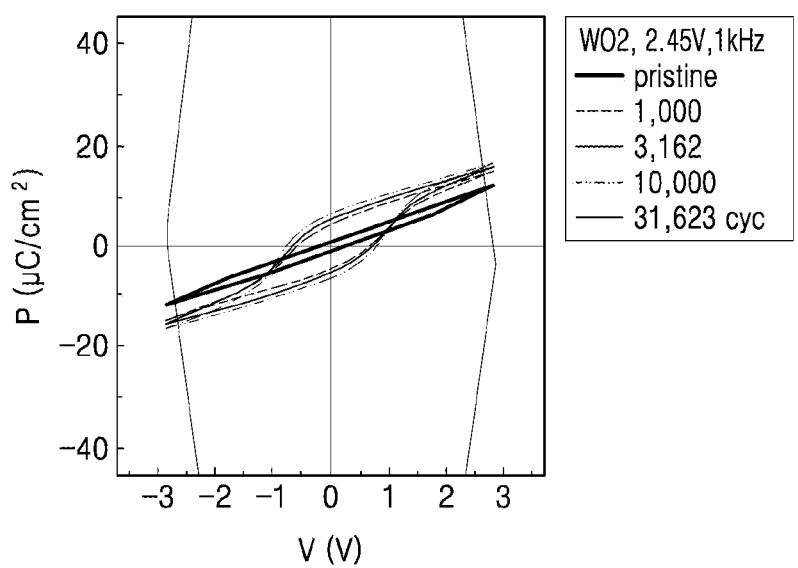

FIGS. 16A and 16B illustrate endurance property and P-V curve changes according to cycles of a device when a dielectric material layer 30' is formed to the 7 nm thickness and in includes 6%-Al doped $HfO_2$ thin film according to the Comparative Example.

As confirmed by the comparison results shown in FIGS. 16A, 16B, 13A and 13B, a wake-up phenomenon occurs that switchable spontaneous polarization increases by the application of an electrical signal, and the spontaneous polarization of samples steadily increases as the polarization of the samples is switched with an electrical field of 3.5 MV/cm, irrespective of the distribution of dopant concentrations. However, the sample having a low uniformity in the dopant distribution shows significantly lower endurance.

As described above, according to the thin film structure 10 according to the embodiment, the dielectric material layer 30 exhibiting a ferroelectric property is formed to include a dopant into a matrix material having a fluorite structure, and in which the ratio of the concentration mean to the concentration standard deviation of the dopant in the direction of thickness is about 8 or greater, and the thickness uniformity is 90% or greater.

Therefore, the thin film structure 10 according to an embodiment includes the dielectric material layer 30 having a uniform dopant concentration and exhibiting such a ferroelectric property, and thus may be applied to various electronic devices including, for example, a nonvolatile memory device, such as an FERAM, a next-generation memory device, a neuromorphic device, a capacitor, and a transistor.

Figure 17:
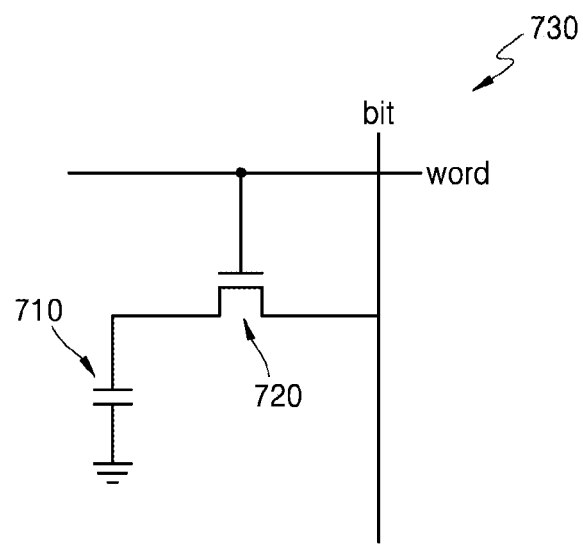
FIG. 17 illustrates a circuit configuration of a memory cell of a memory device including a semiconductor device and a capacitor.
Figure 18:
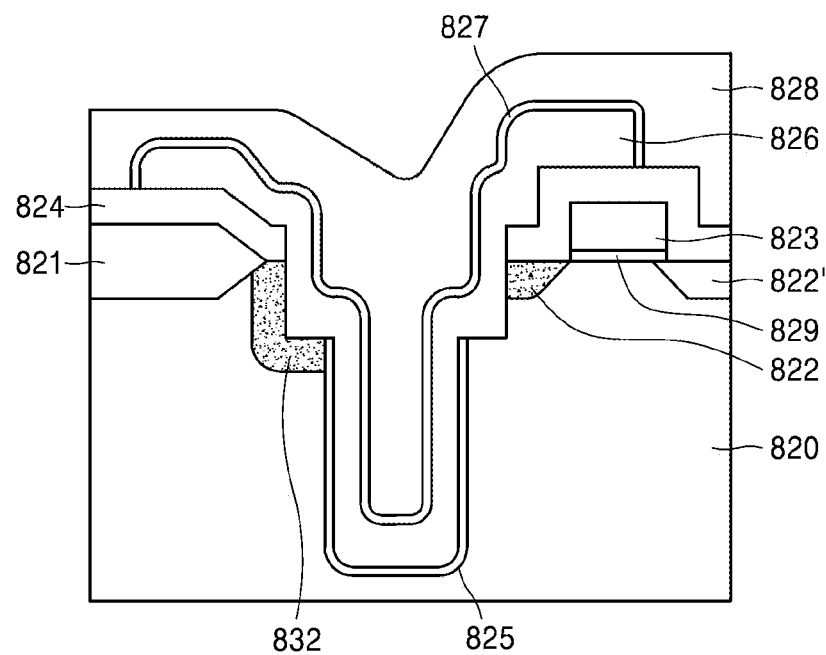
FIG. 18 illustrates a structure of a trench capacitor-type dynamic random access memory (DRAM) according to some example embodiments.

The transistor 720 and the capacitor 710 described above together may constitute a memory cell. For example, FIG. 17 illustrates a circuit configuration of a memory cell 730 of a memory device including the transistor 720 and the capacitor 710. FIG. 18 illustrates an example embodiment of an integrated circuit design including the memory cell. Referring to FIG. 17, the memory cell 730 may include the transistor 720 and the capacitor 710 electrically connected to a source region 822 of the transistor 720. The memory device may include a plurality of bit lines and a plurality of word lines, and may further include a plurality of the memory cells illustrated in FIG. 17. Each word line may be electrically connected to a gate electrode 823 of the transistor 720, and each bit line may be electrically connected to a drain region 822' of the transistor 720. A first electrode 826 of the capacitor 710 may be electrically connected to the source region 822 of the transistor 720, and a second electrode of the capacitor 710 may be connected to, for example, a voltage controller (not shown).

FIG. 18 illustrates a structure of a trench capacitor-type dynamic random access memory (DRAM) according to some example embodiments.

Referring to FIG. 18, on a semiconductor substrate 820, a device isolation region may be defined with a field oxide film 821, and a gate electrode 823 and source/drain impurity regions 822 and 822' may be formed in the device isolation region. A gate oxide layer 829 may be formed between the gate electrode 823 and the semiconductor substrate 820. An oxide film may be formed as an interlayer insulating film 824. A region not to be a trench may be capped with a trench buffer layer, and a part of the source region 822 may be open to form a contact portion.

A trench is formed in a sidewall of the interlayer insulating film 824, and a sidewall oxide film 825 may be formed over the entire sidewall of the trench. The sidewall oxide film 825 may compensate for damage in the semiconductor substrate caused by etching to form the trench, and may serve as a dielectric film between the semiconductor substrate 820 and a storage electrode 826. A sidewall portion of part of the source region 822, except for the other part of the source region near the gate electrode 823, may be entirely exposed.

A PN junction (not illustrated) may be formed in the sidewall portion of the source region by impurity implantation. The trench may be formed in the source region 822. A sidewall of the trench near the gate may directly contact the source region 822, and the PN junction may be formed by additional impurity implantation into the source region.

A storage electrode 826 may be formed on part of the interlayer insulating film 824, the exposed source region 822, and the surface of the sidewall oxide film 825 in the trench. The storage electrode 826 may be formed to contact the entire source region 822 in contact with the upper sidewall of the trench, in addition to the part of the source region 822 near the gate electrode 823. Next, an insulating film 827 as a capacity dielectric film may be formed along the upper surface of the storage electrode 826, and a polysilicon layer as a plate electrode 828 may be formed thereon, thereby completing a trench capacitor type DRAM. The gate insulting film 829, the insulating film 827, and/or the interlayer insulating film 824, for example, may include an embodiment of the dielectric material layer 30, as described above.

Figure 19:
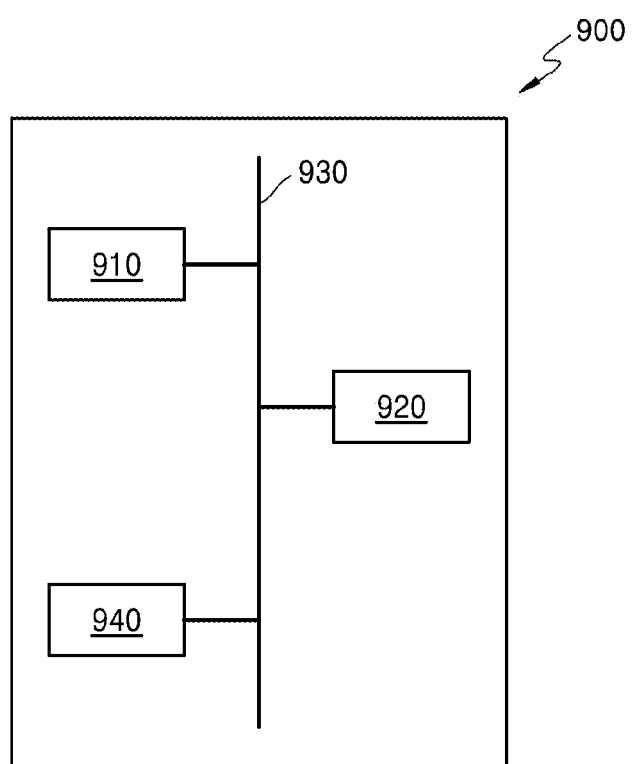
FIG. 19 shows a schematic of a circuit that may include the aforementioned electronic devices according to some example embodiments.

FIG. 19 shows a schematic of a circuit that may include the aforementioned electronic devices according to some example embodiments.

As shown, the electronic device 900 includes one or more electronic device components, including a processor (e.g., processing circuitry) 910 and a memory 920 that are communicatively coupled together via a bus 930.

The processing circuitry 910, may be included in, may include, and/or may be implemented by one or more instances of processing circuitry such as hardware including logic circuits, a hardware/software combination such as a processor executing software; or a combination thereof. For example, the processing circuitry 910 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 620 may include a non-transitory computer readable storage device, for example a solid state drive (SSD), storing a program of instructions, and the processing circuitry 910 may be configured to execute the program of instructions to implement the functionality of the electronic device 900.

In some example embodiments, the electronic device 900 may include one or more additional components 940, coupled to bus 930, which may include, for example, a power supply, a light sensor, a light-emitting device, any combination thereof, or the like. In some example embodiments, one or more of the processing circuitry 910, memory 920, and/or one or more additional components 940 may include an electronic device including electrodes and the dielectric material layer 30, as described above, such that the one or more of the processing circuitry 910, memory 920, and/or one or more additional components 940, and thus, the electronic device 900, may include a transistor 720, a capacitor 710, and/or a memory cell 730 including the thin film structure 10 and 10'.

The electronic device 900 including the thin film structure 10 may constitute an integrated device. The integrated device may constitute part of a silicon based integrated circuit, and such an integrated circuit may include a plurality of capacitors, transistors, memory devices, and the like. By including the dielectric material layer 30 having a ferroelectric property, such devices may achieve higher performance and a smaller size as desired.

The thin film structure according to one or more embodiments is capable of achieving a device including a dielectric material layer having a ferroelectric property, the dielectric material layer formed by atomic layer deposition and having a more uniform dopant concentration in the direction of thickness using a process of adding a small amount of dopant. The thin film structure may have improved uniformity of the doping concentrations in the direction of thickness, and thus the ferroelectric property and endurance thereof may also be enhanced. In addition, various electronic devices including, for example, a nonvolatile memory device, a next-generation memory device, a neuromorphic device, a capacitor, and the like, may be achieved by employing the thin film structure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A thin film structure comprising:
   a first material layer;
   a dielectric material layer having ferroelectricity on the first material layer, the dielectric material layer including a matrix material having a fluorite structure and a dopant, a ratio of a concentration mean to a concentration standard deviation of the dopant in a thickness direction of the dielectric material layer is 8 or greater, and a thickness uniformity of the dielectric material layer is 90% or greater; and
   a second material layer on the dielectric material layer.

2. The thin film structure of claim 1, wherein the matrix material of the dielectric material layer is formed by atomic layer deposition.

3. The thin film structure of claim 2, wherein the matrix material of the dielectric material layer is an oxide, and
   wherein the atomic layer deposition includes sequential injection cycles of a precursor and an oxidant, and an injection of the dopant between a precursor injection cycle and an oxidant injection cycle of at least one of the sequential injection cycles.

4. The thin film structure of claim 3, wherein the oxide includes a metal oxide.

5. The thin film structure of claim 4, wherein the matrix material of the dielectric material layer includes at least one of $HfO_2$, $ZrO_2$, and $CeO_2$.

6. The thin film structure of claim 5, wherein the dopant includes at least one of Al, Si, Zr, Y, La, Gd, and Sr.

7. The thin film structure of claim 4, wherein the dopant includes at least one of Al, Si, Zr, Y, La, Gd, and Sr.

8. The thin film structure of claim 1, wherein the matrix material of the dielectric material layer includes a metal oxide.

9. The thin film structure of claim 8, wherein the matrix material of the dielectric material layer includes one of $HfO_2$, $ZrO_2$, and $CeO_2$.

10. The thin film structure of claim 9, wherein the dopant includes at least one of Al, Si, Zr, Y, La, Gd, and Sr.

11. The thin film structure of claim 8, wherein the dopant includes at least one of Al, Si, Zr, Y, La, Gd, and Sr.

12. The thin film structure of claim 1, wherein the first material layer includes a first conductive layer,
    the second material layer includes a second conductive layer, and
    the first conductive layer and the second conductive layer include the same conductive material or conductive materials having at least one component different from each other.

13. The thin film structure of claim 12, wherein at least one of the first conductive layer and the second conductive layer includes at least of Ti, TiN, TiAlN, TiAl, Ta, TaN, W, WN, Mo, MoN, Nb, NbN, Ru, RuO, Pt, and Ni.

14. The thin film structure of claim 1, wherein one of the first material layer and the second material layer includes a channel layer, and the other includes a conductive layer.

15. The thin film structure of claim 14, wherein the channel layer includes at least one of Si, Ge, IGZO, an oxide semiconductor, a Group III-V semiconductor material, a two dimensional material, a transition metal dichalcogenide, quantum dots, and an organic material.

16. The thin film structure of claim 14, further comprising:
    a second dielectric layer between the channel layer and the dielectric material layer,
    wherein the second dielectric layer is not ferroelectric.

17. An electronic device comprising:
    a base layer; and
    a thin film structure on the base layer, the thin film structure including
    a first material layer,
    a dielectric material layer having ferroelectricity on the first material layer, the dielectric material layer including a matrix material having a fluorite structure and a dopant, a ratio of a concentration mean to a concentration standard deviation of the dopant in a thickness direction of the dielectric material layer is 8 or greater, and a thickness uniformity of the dielectric material layer is 90% or greater, and
    a second material layer on the dielectric material layer.

18. The electronic device of claim 17, wherein the first material layer is a first conductive layer,
    the second material layer is a second conductive layer, and
    the first conductive layer and the second conductive layer include the same conductive material or conductive materials having at least one component different from each other.

19. The electronic device of claim 18, wherein at least one of the first conductive layer and the second conductive layer includes at least of Ti, TiN, TiAlN, TiAl, Ta, TaN, W, WN, Mo, MoN, Nb, NbN, Ru, RuO, Pt, and Ni.

20. The electronic device of claim 17, wherein at least one of the first material layer and the second material layer includes a channel layer and the other includes a conductive layer,
  the channel layer including one of Si, Ge, IGZO, an oxide semiconductor, a Group III-V semiconductor material, a two dimensional material, a transition metal dichalcogenide, quantum dots, and an organic material.

21. A method of forming a thin film structure, the method comprising:
  depositing, through an atomic layer deposition including sequential injection cycles of a precursor and an oxidant, a dielectric material layer onto a first material layer;
  injecting a dopant, through an injection cycle of the dopant between a precursor injection cycle and an oxidant injection cycle of at least one of the sequential injection cycles, into the dielectric material layer; and
  depositing a second material layer onto the dielectric material layer,
  wherein a ratio of a concentration mean to a concentration standard deviation of the dopant in a thickness direction of the dielectric material layer is 8 or greater,
  a thickness uniformity of the dielectric material layer is 90% or greater, and
  wherein the dielectric material layer includes ferroelectric properties.

22. The method of claim 21, wherein the precursor includes a metal precursor.

23. The method of claim 22, wherein the metal precursor includes at least one of Hf, Zr, and Ce.

24. The method of claim 21, wherein the dopant includes at least one of Al, Si, Zr, Y, La, Gd, and Sr.

25. The method of claim 21, wherein the dielectric material layer includes 5% to 15% of the dopant.

26. The method of claim 25, further comprising:
  depositing a second dielectric material layer between the first material layer and the dielectric layer,
  wherein the second dielectric material layer is not ferroelectric.

27. The method of claim 21, wherein at least one of the first and second material layers includes a conductive material.

28. The method of claim 27, wherein the remaining layer includes a semiconductor material.

* * * * *